(12) United States Patent
Sica et al.

(10) Patent No.: US 10,135,177 B2
(45) Date of Patent: Nov. 20, 2018

(54) CABLE TERMINATION WITH AN INTEGRATED MONITORING DEVICE

(71) Applicant: PRYSMIAN S.p.A., Milan (IT)

(72) Inventors: Gerardo Sica, Milan (IT); Paolo Boffi, Milan (IT); Dario Quaggia, Milan (IT)

(73) Assignee: PRYSMIAN S.p.A., Milan (IT)

( * ) Notice: Subject to any disclaimer, the term of this patent is extended or adjusted under 35 U.S.C. 154(b) by 0 days.

(21) Appl. No.: 15/510,123

(22) PCT Filed: Sep. 22, 2014

(86) PCT No.: PCT/EP2014/070120
§ 371 (c)(1),
(2) Date: Mar. 9, 2017

(87) PCT Pub. No.: WO2016/045692
PCT Pub. Date: Mar. 31, 2016

(65) Prior Publication Data
US 2017/0250499 A1   Aug. 31, 2017

(51) Int. Cl.
*H01R 13/58* (2006.01)
*G01R 15/16* (2006.01)
(Continued)

(52) U.S. Cl.
CPC ......... *H01R 13/5845* (2013.01); *G01R 15/16* (2013.01); *G01R 31/021* (2013.01);
(Continued)

(58) Field of Classification Search
CPC ............ H01R 13/6683; H01R 13/5845; H02G 15/064; H02G 15/18; G01R 15/16
See application file for complete search history.

(56) References Cited

U.S. PATENT DOCUMENTS 4,831,214 A * 5/1989 Wilck ............... H02G 15/1806
156/49
2003/0188885 A1 10/2003 Niinobe et al.
(Continued)

FOREIGN PATENT DOCUMENTS

DE   41 25 856 C1   9/1992
DE   4125856 C1 *  9/1992  ........... G01R 15/142
(Continued)

OTHER PUBLICATIONS

International Search Report and Written Opinion dated Jun. 26, 2015, in PCT/EP2014/070120 filed Sep. 22, 2014.

*Primary Examiner* — Timothy Thompson
*Assistant Examiner* — Amol Patel
(74) *Attorney, Agent, or Firm* — Oblon, McClelland, Maier & Neustadt, L.L.P.

(57) ABSTRACT

A cable termination including a cable terminal and a cable joint assembly. The cable terminal includes: a terminal conductor; a monitoring device including a capacitive voltage sensor around the terminal conductor; and an electrically insulating body fitted around the terminal conductor, including a bell-shaped end portion in which the voltage sensor is at least partially embedded. The cable terminal alternatively includes: a terminal conductor; a monitoring device including a capacitive voltage sensor around the terminal conductor; and an electrically insulating body fitted around the terminal conductor, including a bell-shaped end portion in which the voltage sensor is at least partially embedded and a stem end portion, the terminal conductor extending beyond the stem end portion.

20 Claims, 5 Drawing Sheets

(51) Int. Cl.
  *H02G 15/18*   (2006.01)
  *G01R 31/02*   (2006.01)
  *H01R 13/66*   (2006.01)
  *H02G 15/064*  (2006.01)
  *H02G 15/02*   (2006.01)

(52) U.S. Cl.
  CPC ......... *H01R 13/6683* (2013.01); *H02G 15/02* (2013.01); *H02G 15/064* (2013.01); *H02G 15/18* (2013.01); *H02G 15/182* (2013.01)

(56) References Cited

U.S. PATENT DOCUMENTS

| | | |
|---|---|---|
| 2010/0283487 A1 | 11/2010 | Juds et al. |
| 2014/0368221 A1 | 12/2014 | Weinmann et al. |
| 2014/0370741 A1 | 12/2014 | Bolcato et al. |
| 2017/0184634 A1* | 6/2017 | Wentzel ............... G01R 15/146 |

FOREIGN PATENT DOCUMENTS

| | | |
|---|---|---|
| EP | 0 272 131 A2 | 6/1988 |
| EP | 2 051 084 A1 | 4/2009 |
| EP | 2 698 891 A1 | 2/2014 |
| FR | 2 698 695 A1 | 6/1994 |
| WO | WO 2010/128385 A1 | 11/2010 |

\* cited by examiner

CABLE TERMINATION WITH AN INTEGRATED MONITORING DEVICE

BACKGROUND

Technical Field

The present invention relates to a cable termination for an electric alternate current (AC) network, particularly for a medium (MV) and high (HV) voltage electric network. The cable termination according to the invention is equipped with an integrated monitoring device structured to detect status of and faults in the network.

Description of the Related Art

The need of automatically detecting faults in electric networks is increasingly felt. To this end, voltage and/or current sensors are directly applied to the network electric cables or, alternatively, they are integrated in cable terminations.

Generally, the sensors have a circular cross-section with dimension such to embrace and possibly to contact the cable or cable termination diameter. As a result, a sensor with given dimensions will fit only a given size of cable or cable terminations.

For example, document EP 2 051 084 A1 describes an electrical quantity measuring device for energy transport lines, operatively associable to the cable of an electric line or equipment thereof, formed by a device for detecting a voltage signal provided with a through capacitor in metal collar form, arranged coaxially with said cable, connectable to a capacitive divider and a device for detecting a current signal provided with at least a current sensor obtained with a coil susceptible to being crossed by current due to inductive effect. The coil is obtained on at least one printed circuit board equipped with a central opening, and is formed by radial deposits provided on both faces of the printed circuit board and by electric connections arranged between the deposits of the two faces. Through capacitor and coil are axially assembled and are integrally incorporated in an insulating material matrix delimiting a through hole for the insertion of the cable.

Document WO 2013/186069 relates to mounting at least one measurement and/or communication device on a power cable near one end of said cable provided with a termination equipment. In particular, the device is supported by a standard accessory in insulating material that is mounted on said cable end upstream said equipment.

Document EP 2 698 891 describes a terminal connection device comprising an interface cable and a capacitive voltage sensor including a printed circuit board element. The printed circuit board element may be placed over an electrically isolated piece of conductive or semiconductive material. The voltage sensor may be located on a layer of conductive or semiconductive material that is electrically isolated from the conductive or semiconductive layer of the interface cable. However, a ground current needs to be established across the sensor. To achieve this, a portion of the semiconductive layer may be isolated by removing two annular sections of the semiconductive layer of the interface cable on each side of the portion to be isolated. The sensor is then mounted on and connected to this isolated portion. Strips of insulating material cover gaps to separate isolated semiconductive portion from any other conductive or semiconductive material or elements, except from the voltage sensor, and to prevent the presence of air in gaps, which air could cause a partial electrical discharge and a failure of voltage sensor. Insulation layer covers voltage sensor and the portions of semiconductive layer adjacent gaps. Stress control tube covers insulation layer and extends to the end of interface cable to which lug is attached. Current sensor is positioned over semiconductive layer adjacent to voltage sensor.

BRIEF SUMMARY OF THE INVENTION

The Applicant has observed that known sensors used for detecting faults in electric networks, either alone or integrated in cable terminations, having fixed dimensions and a fixed capacitance are unsuitable to fit cables of different size/shape, unless adaptors are used, which however would bring cost increasing and installation complications. Moreover, even when geometrically adapted to the cable size/shape, these sensors need a field calibration, since fitting a sensor on a different cable size/shape results in a different capacitance, thereby requiring a new sensor tuning.

Known cable terminations, such as that of EP 2 698 891, have integrated voltage sensors performing measurements on the cable termination conductor rather than directly on the cable connected thereto. The fitting of the voltage sensors on these terminations is structurally so complex to be hardly industrially manufactured, and have air gaps potentially leading to partial discharges. Also, these known cable terminations use a non-linear stress control (a stress control layer covering the voltage sensor) for managing the electrical field distribution in the sensor zone, and this type of stress control is suitable for medium voltage apparatus.

The Applicant aims at producing a cable termination with integrated monitoring device comprising a capacitive voltage sensor suitable to be coupled to cables of different sizes and shapes, easy to be industrially manufactured, having a compact design and with an air gap-free, simple field control.

The Applicant found that a cable termination with integrated monitoring device, comprising a cable terminal and a cable joint assembly, in which a capacitive voltage sensor is arranged in the cable terminal around a terminal conductor and is at least partially embedded in an insulating bell suitable for controlling the electric field in the cable terminal, is of simple construction, has no need of non-linear stress control layers over the voltage sensor, and is able to be coupled to cables of different sizes and shapes and design.

The resulting integrated cable termination can be easily installed and there is no need of field calibration when the cable shape or size changes, because the cable terminal is not affected by the cable size. Moreover, the monitoring device is advantageously protected from the environment.

In a first aspect, the present invention relates to a cable termination comprising a cable terminal and a cable joint assembly, in which the cable terminal comprises
  a terminal conductor;
  a monitoring device comprising a capacitive voltage sensor around the terminal conductor; and
  an electrically insulating body fitted around the terminal conductor, comprising a bell-shaped end portion in which the voltage sensor is at least partially embedded.

The cable termination of the invention is suitable for a medium- or high-voltage network. In the present description and claims as "medium voltage" it is generally meant voltages in a range of 1 kV to 35 kV, whilst by the term "high voltage" it is generally meant voltages higher than 35 kV.

In the present description and in the annexed claims the term "termination" means an equipment attached to an end of a power cable to provide electrical connection with another component of an electric system, effective to maintain insulation and control of the electric field.

In the present description and claims the term "geometrical stress control" means that the electrical field control is obtained through an appropriate shape of a body made of electrical insulating material.

In the present description and claims the term "non-linear stress control" means that the electrical field control is obtained through a layer or tube of material having non-linear current versus voltage characteristics, preferably a high permittivity material.

Advantageously, the bell-shaped end portion of the electrically insulating body has a width decreasing towards one terminal end, thereby forming a wide base portion and a narrow top portion of the electrically insulating body. The bell-shaped end portion of the electrically insulating body acts as stress or capacitor cone for the cable termination by controlling the electric field distribution. This, possibly in combination with the shape of the capacitive voltage sensor as disclosed in the following, makes the presence of further stress relief arrangements (either of geometric or non-linear type) in the cable termination substantially redundant.

The shape of the electrically insulating body helps to simplify the design of the integrated cable termination of the invention by providing a suitable protection against electrical surges with a limited hindrance and manufacturing complexity.

Preferably, the electrically insulating material of the insulating body is a silicone, or an epoxy resin, or a silicone gel.

Advantageously, the capacitive voltage sensor of the monitoring device integrated in the cable termination of the invention is a hollow cylinder with at least one, preferably both of the rims having a rounded shape.

Preferably, the capacitive voltage sensor has a rim (or first rim) having thickness greater than the thickness of the opposite rim (second rim).

Preferably, at least the thicker rim (first rim) of the capacitive voltage sensor is embedded in the insulating body bell-shaped end portion.

Preferably, shape and size of the first rim of the voltage sensor are such as to act as field deflector or capacitor.

Preferably, the capacitive voltage sensor has a portion protruding out of the insulating body bell-shaped end portion, this protruding portion advantageously comprising the second rim (thinner rim).

Advantageously, the protruding portion of the voltage sensor is covered by an insulating coating.

Alternatively, the capacitive voltage sensor of the present invention is embedded for its full length in the insulating body bell-shaped end portion.

Preferably, the capacitive voltage sensor is made of electrically conducting or semi-conducting material, for example a metal or a carbon black-charged polymer.

Advantageously the monitoring device of the cable terminal of the invention further comprises a current sensor, preferably in form of a coil, for example a Rogowski coil.

The current sensor preferably has a plate shape with a substantially circular central hollow portion and is arranged around the cable terminal conductor.

Advantageously, the current sensor is embedded in the electrically insulating body, preferably in the base portion of the bell-shaped end portion. Such a configuration, besides simplifying the cable termination structure, provides the current sensor with mechanical protection against environmental stresses.

Preferably, the monitoring device of the cable terminal of the invention comprises a processing unit. The processing unit is preferably associated to the current sensor, for simplifying the design of the monitoring device.

Advantageously, the processing unit is attached to the current sensor in a position as close as possible to the voltage sensor. This simplifies the cable connection between the processing unit and the voltage sensor.

Advantageously, the terminal monitoring device comprises an auxiliary cable suitable for transporting data and for ground connection. Preferably, the terminal monitoring device comprises two cables, namely a data cable and a ground cable. The data cable connects the monitoring device, in particular the processing unit, to an external apparatus for transmitting the data collected. The ground cable connects the monitoring device, preferably the current sensor, to earth.

Preferably, the data cable is a shielded cable.

Preferably, the monitoring device comprises linking cable, connecting the capacitive voltage sensor to the processing unit.

Preferably, the linking cable is a shielded cable.

By shielded cable it is meant a cable comprising an electrical conductor, an insulating layer and a metallic shield connected to the ground.

Advantageously, the linking cable is at least partially embedded within the electrically insulating body.

Preferably, the cable joint assembly comprises a connector configured to electrically and mechanically couple an electric cable and the terminal conductor of the cable termination.

Preferably, the connector is a mechanical connector, more preferably applicable to both copper and aluminum conductors or to connect copper to aluminum conductors.

In accordance with an embodiment, the connector is of the "shear-bolts" type.

Advantageously, the cable joint assembly further comprises a sleeve to be positioned in a radial external position with respect to the connector.

Advantageously, the sleeve comprises an insulating joint comprising, in turn:

an internal semi-conductive layer;
a high permittivity layer;
an external insulating layer;
an external semi-conductive layer.

In the present description and claims, as "high permittivity layer" it is meant a layer of polymeric material having a permittivity greater than 5, for example of about 10.

Preferably, the longitudinal extensions of the layers of the insulating joint are such that only the external semiconducting layer at least partially, more preferably totally covers the portion of the capacitive voltage sensor protruding from the bell-shaped end portion of the electrically insulating body.

The external semiconducting layer of the insulating joint is not required to have stress relieving characteristics, and is preferably made of a material having a volumetric resistivity value of 0.5-10 $\Omega$m at room temperature.

Advantageously, the sleeve comprises a braid made of an electrically conductive metal mesh, such as a copper mesh, enveloping the insulating joint. Preferably the braid has a length such to get into contact with the screen of the once coupled electric cable on one end and, optionally, at least partially enveloping the portion of the capacitive voltage sensor protruding into the bell-shaped end portion on the other end.

Preferably, the sleeve further comprises an insulating sheath to be positioned so as to at least partially envelope the insulating joint and, optionally, the metal braid.

Advantageously, the insulating sheath at least partially envelopes the portion of the voltage sensor not embedded into the bell-shaped end portion of the electrically insulating body. Like the external semiconducting layer of the insulating joint, the insulating sheath of the sleeve is not a stress relief arrangement.

The insulating sheath provides electrical and mechanical protection to the insulating joint and advantageously has anti-tracking properties. To this end, the insulating sheath is advantageously made of silicone rubber.

Advantageously, at least one of the two shielded cables of the monitoring device, particularly the data cable and/or the ground cable, runs at least partially in the sleeve, more preferably between the insulating sheath and the insulating joint.

In accordance with another aspect, the present invention relates to a cable terminal, which comprises
- a terminal conductor;
- a monitoring device comprising a capacitive voltage sensor around the terminal conductor; and
- an electrically insulating body fitted around the terminal conductor, comprising a bell-shaped end portion in which the voltage sensor is at least partially embedded and a stem end portion, the terminal conductor extending beyond the stem end portion.

The cable termination of the invention can be either for outdoor or for indoor cable termination applications. In case of outdoor application, the cable termination is advantageously provided with sheds for suitably extending the surface path in the presence of atmospheric contaminants and natural phenomena.

The cable termination of the invention is preferably intended to be used in MV networks.

BRIEF DESCRIPTION OF THE DRAWINGS

Further characteristics and advantages will be more apparent from the following description of a preferred embodiment and of its alternatives given as a way of an example with reference to the enclosed drawings in which.

DETAILED DESCRIPTION

In the following description, same alphanumeric references are used for analogous exemplary elements when they are depicted in different drawings.

Figure 1:
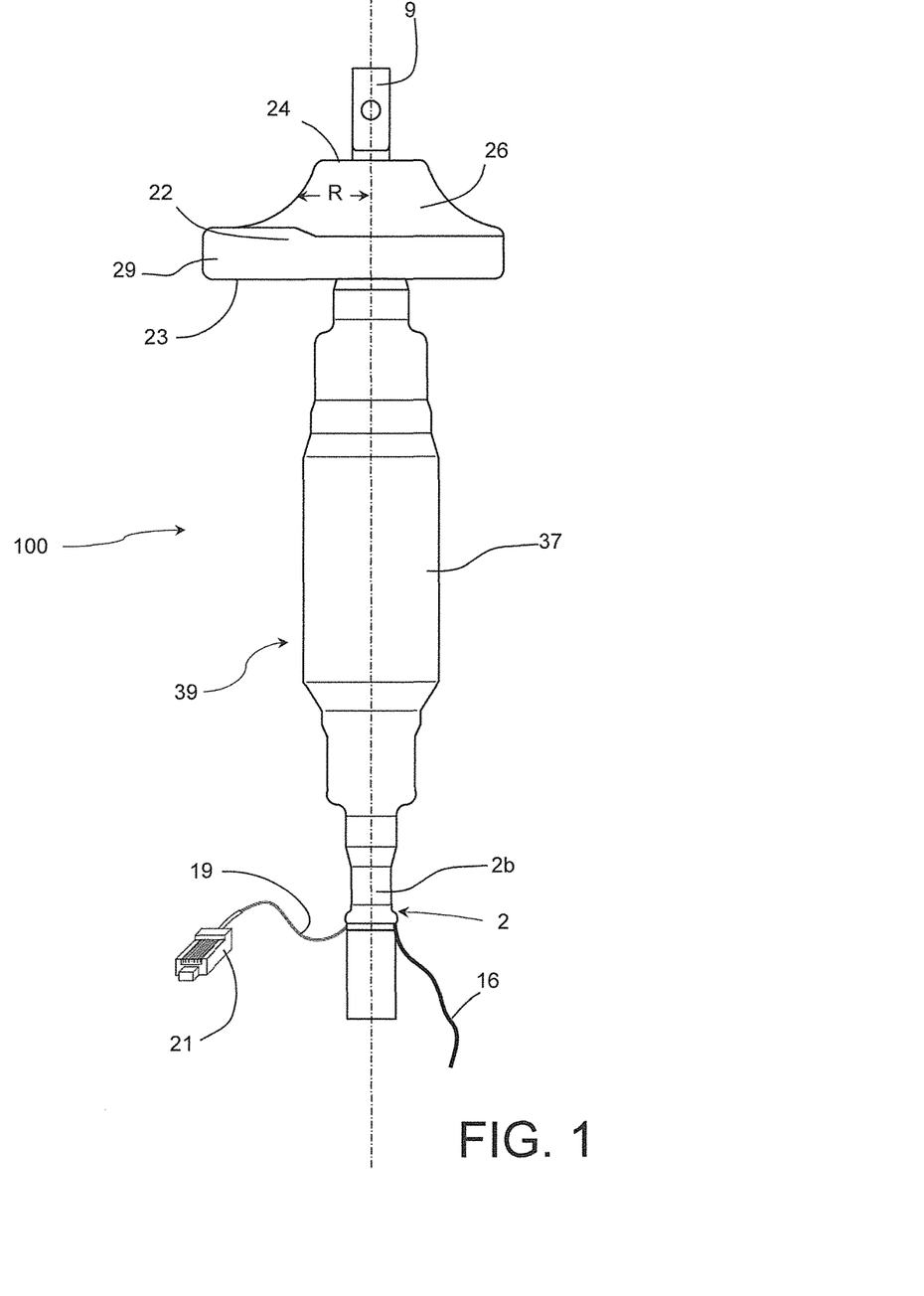
FIG. 1 shows a side view of a cable termination according to the present invention in assembled condition and joined to a power cable.
Figure 2:
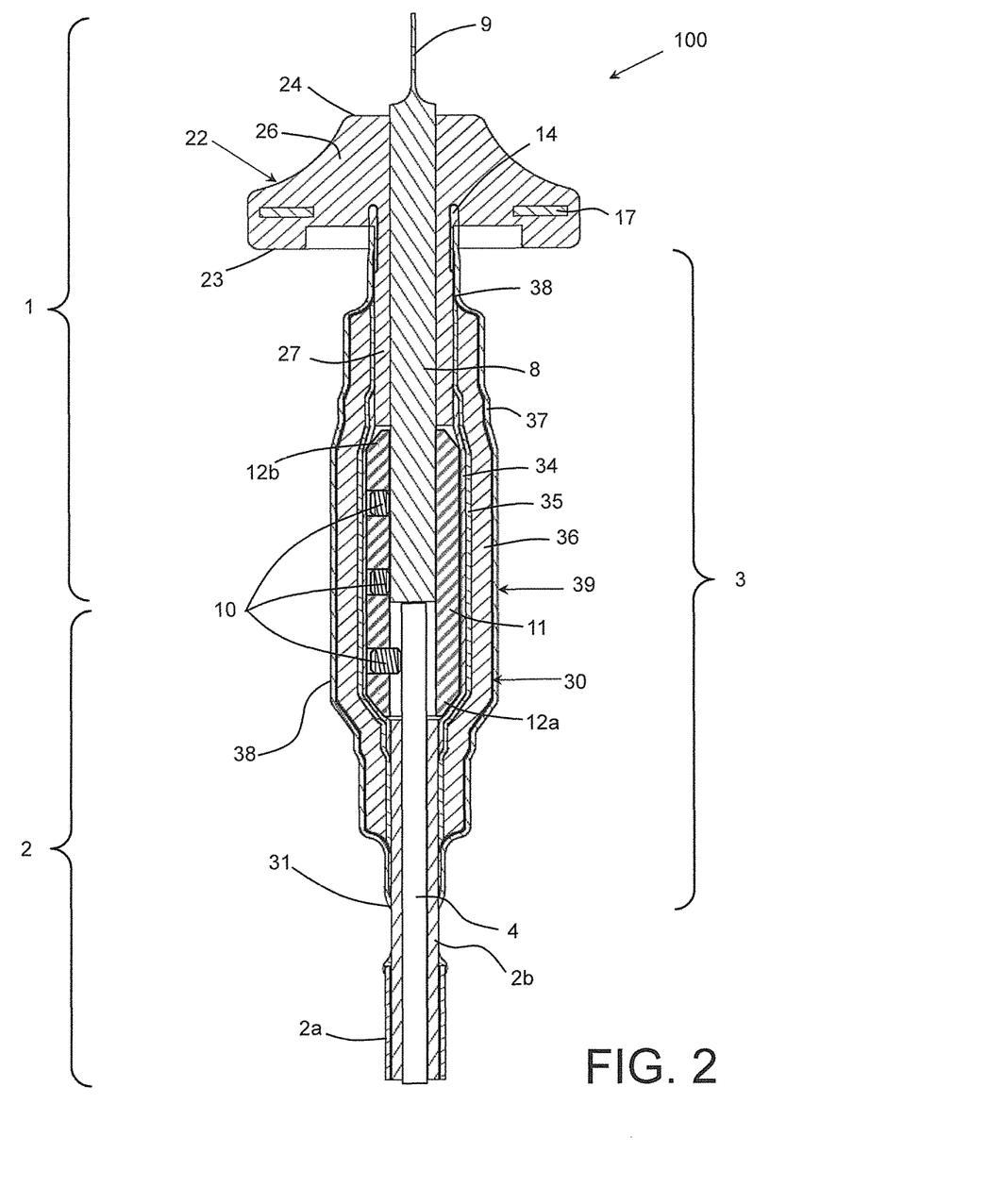
FIG. 2 shows a section view along the plane II-II of FIG. 1 of the cable termination according to the present invention.

FIGS. 1-2 show a particular embodiment of a cable termination 100 according to the present invention in assembled condition. In particular, the cable termination 100 comprises a cable terminal 1 and a cable joint assembly 3.

In FIGS. 1 and 2 a cable 2 is connected to the cable termination 100 of the invention. For accomplishing such connection, the outer layers 2a (comprising, for example, an outer jacket, one or more screens and outer semiconducting layer) of cable 2 are partially removed from the underlying layers 2b (comprising, for example, insulating layer and inner semiconducting layer) and an electrically conductive core 4, and the underlying layers 3 are partially removed from the electrically conductive core 4.

The cable terminal 1 comprises a terminal conductor 8 having the function of electrically connecting the terminal 1 with the cable 2 at one end and, at the opposite end, with other parts of the electric system, such as external apparatuses. To this purpose, the terminal conductor 8 comprises or forms or is connected to a terminal lug 9, protruding from the conductor 8 at the end portion opposite to that of the connection with cable 2 so to be easily accessible for a user. The terminal conductor 8 has an elongated shape, and is made of an electrically conductive material, such as a copper or aluminum or composite thereof.

The terminal conductor 8 and the cable 2 are connected, both mechanically and electrically, by means of a mechanical connector 11 comprised in the cable termination 100. The connector 11 is a range taking one, suitable to join electric conductors of different shape and/or size and/or material. For example, the connector is of the so called "shear-bolts" type. In this type of connector, an end portion of cable 2, specifically the end of the conductive core 4 bare of the any overlying layer 2a, 2b, is operatively joined to the connector 11 at a connector first end 12a and is locked in position by contact pressure controlled by bolts 10 (to be inserted in bolt seats 10a as from FIG. 4b) which may have a tapered or a weak portion and shear off at predetermined torque. Such an arrangement can allow the locking of cables having different section shapes and sizes, for example from 70 to 240 $mm^2$.

The terminal conductor 8 is inserted into the connector 11 at a connector second end 12b opposite to the connector first end 12a and locked in position by a contact pressure controlled by bolts 10 as above. In this manner, both the cable conductive core 4 and the terminal conductor 8 are coupled to the connector 11 and, consequently, mechanically and electrically coupled each other. An enlarged view of the connector 11 according to a possible embodiment is shown in FIG. 4b.

The cable terminal 1 comprises an electrically insulating body 22 made of an electrically insulating material and located in the vicinity of the terminal lug 9. The insulating body 22 comprises a bell-shaped end portion 26 where the capacitive voltage sensor 14 is at least partially embedded, as it will be explained further on.

The bell-shaped end portion 26 has a radial width R (with reference to the longitudinal axis, lying on the plane II-II as indicated in FIG. 1) decreasing from one end to another, preferably decreasing towards the terminal lug 9. The bell-shaped end portion 26 has a base portion 23 and a top portion 24, the top portion 24 being closer to the terminal lug 9 than the base portion 23. The bell-shaped end portion 26 of the insulating body 22 is advantageously suitable for controlling the electric gradient, while conveniently at least partially embedding the sensor 14 and, possibly, the whole current sensor 17.

Figure 5:
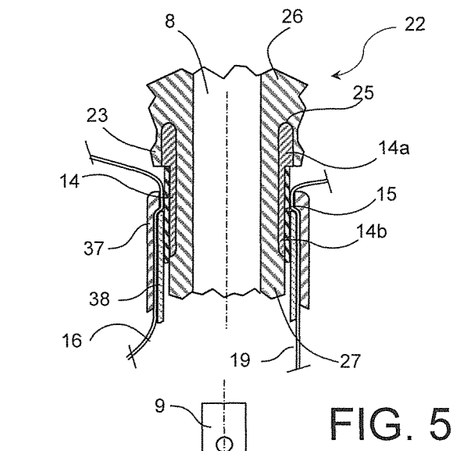
FIG. 5 shows a detail of the positioning of a capacitive voltage sensor in the cable termination of the present invention.

According to a possible embodiment, the bell-shaped end portion 26 of the insulating body 22 comprises a recess 25 into the base portion 23 suitable to embed the first rim 14a of the voltage sensor 14 (as from FIG. 5). The recess 25 has a shape, advantageously, at least partially matching the voltage sensor 14 shape.

The insulating body 22 further comprises a stem end portion 27 projecting from the base portion 23, which is preferably made in one piece (or monolithic) with and in the same material of the bell-shaped end portion 26. The bell-shaped end portion 26 and the stem end portion 27 form a substantially central through opening suitable to accommodate the insulating body 22 onto the terminal conductor 8.

The insulating body 22 is fitted around the terminal conductor 8, so to be integral with the latter. For example, the insulating body 22 can be molded directly on the terminal conductor 8.

The electrically insulating body 22 is preferably made of curable electrically insulating material. Advantageously, the electrically insulating material can be cured at room temperature and pressure in order to avoid any damage to the monitoring unit during the manufacturing process. For example, the electrically insulating material can be a silicone, an epoxy resin, or a silicone gel.

Figure 3:
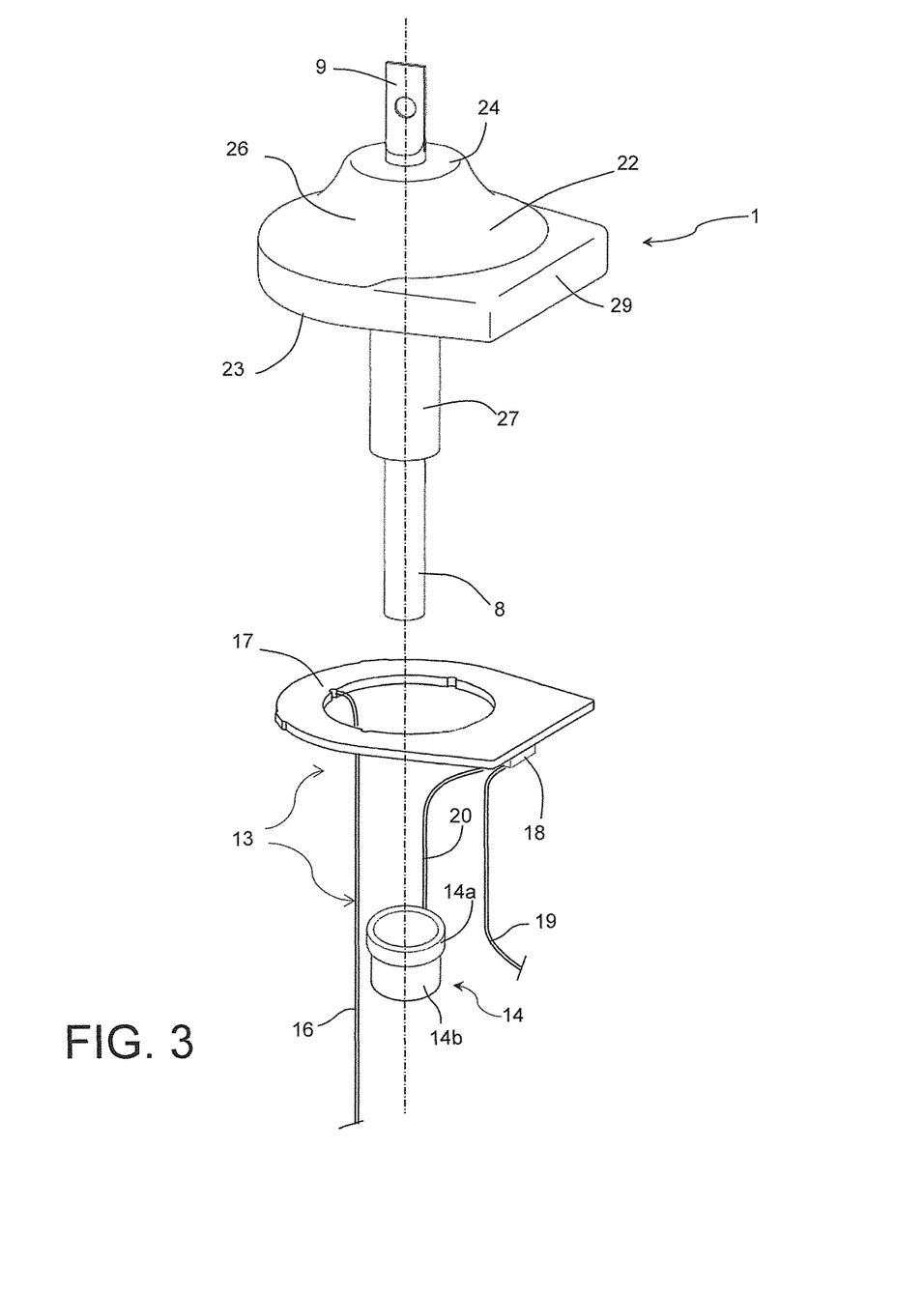
FIG. 3 shows an exploded perspective view of a cable terminal according to the present invention.

The cable terminal 1 comprises a monitoring device 13 for sensing, measuring, recording and saving or transmitting information regarding the condition or operation of the power cable such as current and voltage, so detecting possible faults in the network. The monitoring device 13 is located in the vicinity of the terminal lug 9. An enlarged exploded view of the monitoring device 13 integrated in the cable termination according to an embodiment of the invention is shown in FIG. 3, while cross section views are shown in FIGS. 2 and 7, as it will be detailed in the following.

Figure 7:
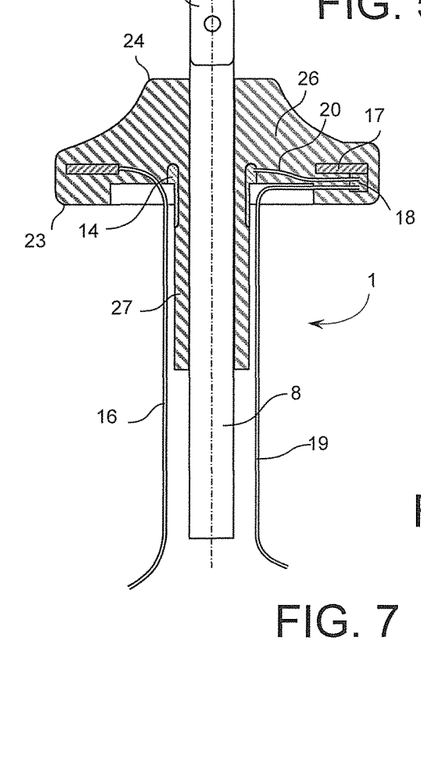
FIG. 7 shows a section view of a cable terminal according to the present invention.

The monitoring device 13 comprises a capacitive voltage sensor 14 located around the terminal conductor 8 and in contact with the electrically insulating body 22 surrounding the terminal conductor 8, as from FIGS. 2, 5 and 7. The voltage sensor 14 is able to perform measurements on the terminal conductor 8, which is electrically coupled with the cable 2, as discussed above. Since the size and shape, in particular the diameter, of the terminal conductor 8 are uniform, the capacitance is fixed and therefore measurements performed by voltage sensor 14 are independent from the shape and size of the cable 2, which can be therefore substituted without requiring a new field tuning of the sensor and/or a geometrical adapter.

Advantageously, capacitive voltage sensor 14 has at least one rounded shaped rim. As shown in FIGS. 3 and 5, voltage sensor 14 has a first rim 14a and a second rim 14b, the first rim 14a having a larger thickness than the second rim 14b. The first rim 14a acts as field deflector. Together with the electrically insulating body, the first rim shape and size makes the presence of further stress relief arrangements (both geometric and non-linear) redundant. Both rims 14a, 14b preferably have a rounded profile.

In the cable terminal 1, the voltage sensor 14 is preferably positioned so as the thicker first rim 14a is closer to the terminal lug 9 than the second rim 14b. The first rim 14a is preferably the portion of the voltage sensor 14 embedded in the bell-shaped end portion 26.

As from FIG. 5, an insulating coating 15 covers and is in contact with the portion of the voltage sensor 14 out of the bell-shaped end portion 26 and comprising the second rim 14b. Preferably, the insulating coating 15 is made by wrapping an insulating tape around the protruding portion of the voltage sensor 14.

The voltage sensor 14 can be made, for example, of a metal, such as tinned brass, or of a semiconducting compound, for example ethylene propylene rubber charged with carbon black.

The monitoring device 13 further comprises a current sensor 17. The current sensor 17 is in form of a plate with a coil (not shown) embedded into. In the embodiment of FIGS. 2, 3 and 7, a processing unit 18 is provided on a portion of the current sensor plate and is preferably arranged on the current sensor surface facing the voltage sensor 14. This position, besides providing a more compact design, allows minimizing the electric connection between the processing unit 18 and the voltage sensor 14, said connection being effect by, for example, a linking cable 20.

In the embodiments of FIGS. 3, 5 and 7, the monitoring device 13 further comprises a data cable 19 configured to connect the monitoring device 13, in particular the processing unit 18, to external apparatuses able to collect and analyze the measurement data. The data cable 19 comprises, advantageously, an end plug 21 configured to connect the monitoring device 13 to external apparatuses.

In the embodiments of FIGS. 3, 5 and 7, the monitoring device 13 further comprises a ground cable 16 configured to connect the monitoring device 13 in particular the current sensor 17, to earth.

In the embodiments of FIGS. 3 and 7, the monitoring device 13 further comprises a linking cable 20, configured to connect the voltage sensor 14 to the processing unit 18, to collect measurement data.

Preferably, data cable 19 and linking cable 20 are shielded cables.

The monitoring device 13 is at least partially housed in the electrically insulating body 22. In particular, the current sensor 17, advantageously bearing the processing unit 18, is preferably embedded in or coated by the electrically insulating material of the insulating body bell-shaped end portion 26. Also the linking cable 20 can be at least partially housed in the insulating body bell-shaped end portion 26. Such a positioning makes the cable terminal more compact and provides the current sensor 17, the processing unit 18 and the linking cable 20 of the monitoring device 13 with protection from the environment. However, it is to be noted that the current sensor 17 and the processing unit 18, and the linking cable 20 accordingly, are not necessarily housed in the insulating body 22, particularly in the bell-shaped end portion 26, since both of them can be at a distance from the terminal conductor 8.

In accordance with the embodiments shown in FIGS. 1, 2, 3 and 7, the current sensor 17 and the processing unit 18 are embedded in the insulating body 22, particularly at the base portion 23 of the bell-shaped end portion 26. In order to more conveniently embed the current sensor 17 and/or the processing unit 18, the base portion 23 may have an abutting portion 29 preferably substantially perpendicular to the termination longitudinal axis II-II.

Figure 4A:
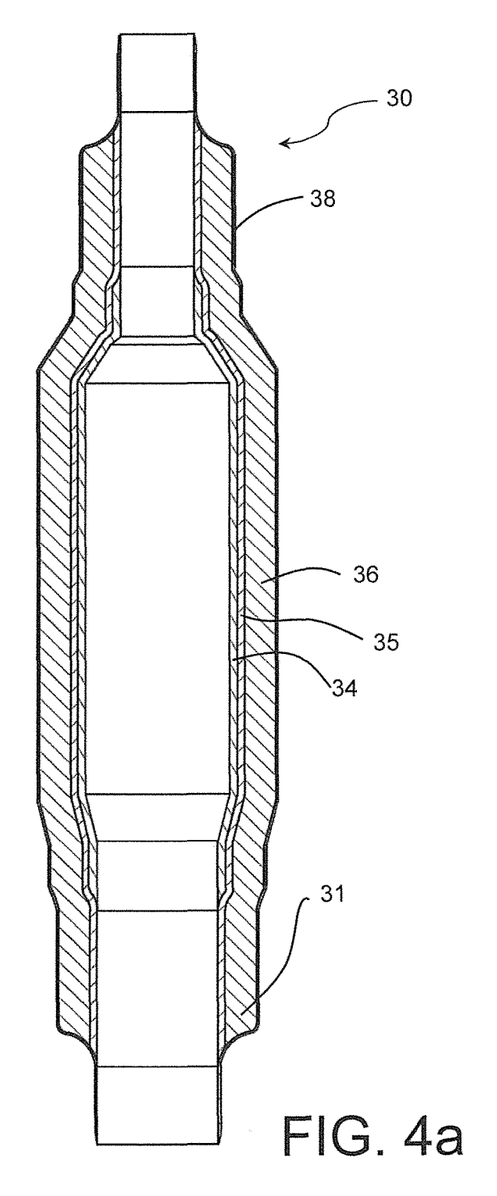
FIG. 4a shows a section view of an insulating joint for the cable termination of the present invention.
Figure 4B:
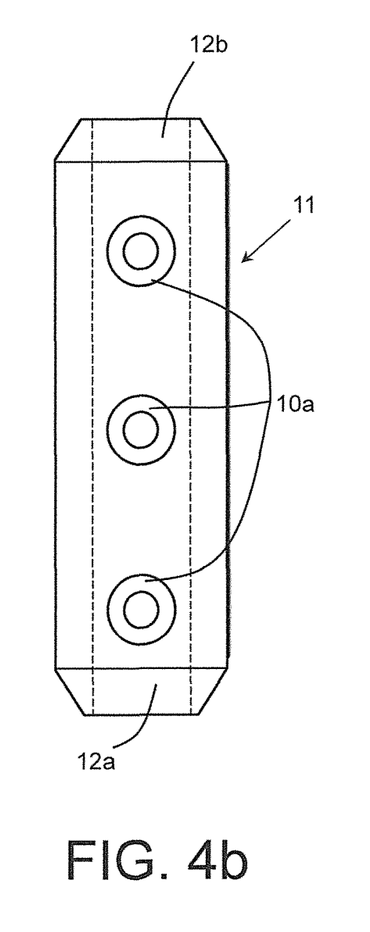
FIG. 4b shows a sketched view of a connector for the cable termination of the present invention.
Figure 6:
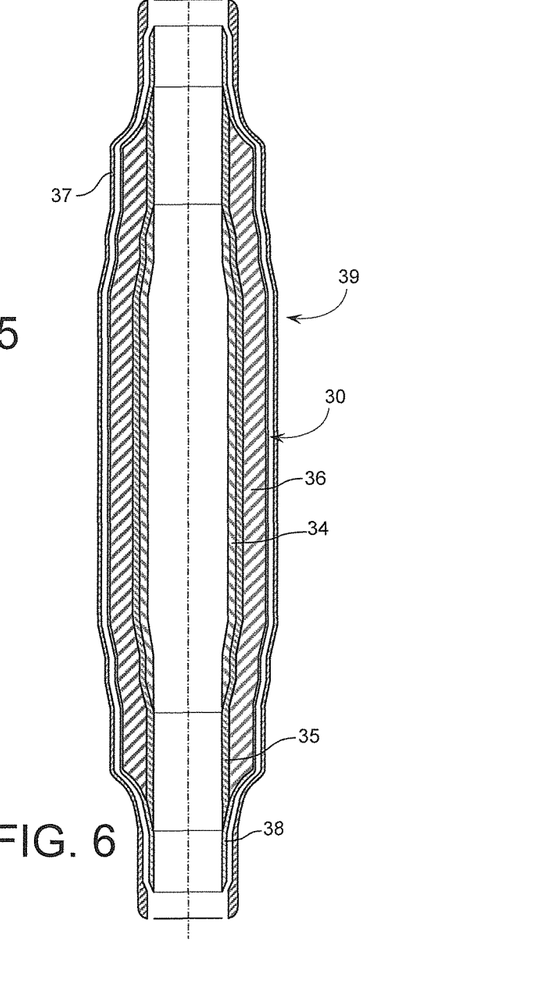
FIG. 6 shows a section view of a sleeve for the cable termination of the present invention.

The cable joint assembly 3 of the termination 100 further comprises a sleeve 39 comprising, in turn, an insulating joint 30 and, advantageously, an insulating sheath 37, as from FIGS. 2, 4a and 6.

The sleeve 39 provides electrical insulation and stress relief to the connection between cable 2 and terminal conductor 8 and to the portions of cable 2 exposed for the connecting procedure. Advantageously, the sleeve 39 also at least partially covers the stem end portion 27 of the electrically insulating body 22 and the capacitive voltage sensor 14.

An exemplary section view of the insulating joint 30 is shown in FIGS. 2, 4a and 6. The joint 30 comprises:
- an internal semi-conductive layer 34, for example made of EPR (ethylene-propylene rubber) or ethylene-propylene-diene rubber (EPDM) charged with a conductive filler;
- a high permittivity layer 35, for example made of EPDM, configured to limit the electric gradient;
- an external insulating layer 36, for example made of EPR; and
- an external semi-conductive layer 38 for example made of EPR or EPDM charged with a conductive filler.

Preferably, the insulating joint 30 is a cold-shrink joint. An example of cold-shrink joint is disclosed in WO06/046089. The insulating joint 30 and its component collapse onto the underlying portions of the kit 100 when assembled, and take the shape thereof.

Preferably, the external semiconducting layer 38 at least partially, and more preferably totally, covers the portion of the capacitive voltage sensor 14 protruding from the bell-shaped end portion 26, and it is in direct contact with the insulating coating 15 covering said portion, as shown in FIGS. 2 and 5.

Advantageously, an insulating sheath 37 envelopes the insulating joint 30 when the termination 100 is assembled (as shown in FIG. 6, where the sheath 37 is represented as fictitiously detached from the underlying insulating joint 30). The insulating sheath 37, can be made, for example, of silicone rubber.

The insulating sheath 37 can at least partially envelope the portion of the voltage sensor 14 not embedded into the bell-shaped end portion 26 of the electrically insulating body 22, as shown in FIGS. 2 and 5.

Advantageously, the ground cable 16 and the data cable 19 of the monitoring device 13 are positioned so to at least partially run in said sleeve 39. Preferably, during cable termination 100 assembling, both cables 16 and 19 are laid over the external semi-conductive layer 38 of the insulating joint 30 and the insulating sheath 37 is made to shrink around them all, such that both cables 16 and 19 run between the insulating sheath 37 and the external semi-conductive layer 38 of the insulating joint 30 in the assembled cable termination 100. In this manner, the cables 16 and 19 are mechanically protected and the overall appearance and handling of the cable termination 100 is improved.

Advantageously, the sleeve 39 comprises a metal braid (not shown) enveloping the insulating joint 30 and, at least partially, the capacitive voltage sensor 14. In turn the metal braid is covered by the insulating sheath 37.

According to an embodiment of the invention, during the cable termination assembling, the insulating joint 30 and, if present, the insulating sheath 37 and/or the metal braid are slipped—together or independently, and preferably mounted onto a tubular support—onto the cable 2 at a distance from the cable end. When the cable 2 and the terminal conductor 8 are inserted and locked in the connector 11, the insulating joint 30 is fitted onto the connector 11 as shown in FIG. 2, for example by removing the tubular support, the ground cable 16 and the data cable 19 are position along the joint surface, and the insulating sheath 37 and/or the metal braid is fitted onto the joint 30 as shown in FIG. 2, for example by removing the tubular support, and over the ground cable 16 and the data cable 19.

The cable termination of the invention is equipped with a monitoring system suitable for performing a variety of functions such as detecting polyphase and phase to ground faults with insulated or grounded by impedance neutral; alarming the circuit breaker opening and closing the circuit in case of fault; detecting voltage absence; metering voltage, current and active/reactive power on the network; interfacing with grid generators for coordinating line voltage regulation and the remote disconnecting signals.

The invention claimed is:

1. A cable termination comprising:
    a cable terminal; and
    a cable joint assembly,
    wherein the cable terminal includes:
        a terminal conductor,
        a monitoring device having a capacitive voltage sensor around the terminal conductor, and
        an electrically insulating body fitted around the terminal conductor, the electrically insulating body having:
            a bell-shaped end portion in which the capacitive voltage sensor is at least partially embedded,
            wherein, in a side view, the electrically insulating body does not overlap a bottom portion of the terminal conductor.

2. A cable termination according to claim 1, wherein the capacitive voltage sensor includes a hollow cylinder including a first rim and a second rim, at least the first rim having a rounded shape.

3. A cable termination according to claim 2, wherein the first rim has a thickness greater than a thickness of the second rim.

4. A cable termination according to claim 2, wherein the first rim is embedded in the bell-shaped end portion.

5. A cable termination according to claim 1, wherein the capacitive voltage sensor includes a protruding portion that protrudes out of the bell-shaped end portion of the electrically insulating body.

6. A cable termination according to claim 5, wherein the protruding portion of the capacitive voltage sensor is covered by an insulating coating.

7. A cable termination according to claim 1, wherein the monitoring device has a current sensor.

8. A cable termination according to claim 7, wherein the current sensor is embedded in the bell-shaped end portion.

9. A cable termination according to claim 1, wherein the monitoring device comprises a processor.

10. A cable termination according to claim 9,
    wherein the monitoring device has a current sensor, and
    wherein the processor is positioned on a surface of the current sensor facing the capacitive voltage sensor.

11. A cable termination according to claim 1, wherein the cable joint assembly includes a mechanical connector.

12. A cable termination according to claim 1, wherein the cable joint assembly includes a sleeve.

13. A cable termination according to claim 12, wherein the sleeve has an insulating joint comprising, in turn, layers of:
    an internal semi-conductive layer;
    a high permittivity layer;
    an external insulating layer; and
    an external semi-conductive layer.

14. A cable termination according to claim 13,
    wherein the capacitive voltage sensor includes a protruding portion that protrudes out of the bell-shaped end portion of the electrically insulating body, and
    wherein the layers have longitudinal extensions such that only the external semi-conductive layer at least partially covers the protruding portion of the capacitive voltage sensor that protrudes out of the bell-shaped end portion of the electrically insulating body.

15. A cable termination according to claim 12, wherein the sleeve includes an insulating sheath.

16. A cable termination according to claim 1,
wherein the electrically insulating body further has a stem end portion that extends from the bell-shaped end portion,
wherein a first portion of the capacitive voltage sensor is at least partially embedded in the bell-shaped end portion, and
wherein a second portion of the capacitive voltage sensor is at least partially embedded in the stem end portion.

17. A cable termination according to claim 1, wherein, in the side view, no portion of the bell-shaped end portion overlaps the bottom portion of the terminal conductor.

18. A cable termination according to claim 1, wherein the cable joint assembly is configured to surround a portion of the cable terminal and a portion of a cable configured to be electrically connected to the cable terminal.

19. A cable termination according to claim 1, wherein the electrically insulating body is in direct contact with the terminal conductor.

20. A cable terminal, comprising:
a terminal conductor;
a monitoring device including a capacitive voltage sensor around the terminal conductor; and
an electrically insulating body fitted around the terminal conductor, the electrically insulating body having:
a bell-shaped end portion in which the capacitive voltage sensor is at least partially embedded, and
a stem end portion,
wherein the terminal conductor extends beyond the stem end portion, and
wherein, in a side view, the electrically insulating body does not overlap a bottom portion of the terminal conductor.

* * * * *